United States Patent
Shalvi et al.

(10) Patent No.: US 8,949,684 B1
(45) Date of Patent: Feb. 3, 2015

(54) SEGMENTED DATA STORAGE

(75) Inventors: Ofir Shalvi, Ra'anana (IL); Barak Rotbard, Tel Aviv (IL); Oren Golov, Hod Hasharon (IL); Micha Anholt, Tel Aviv (IL); Uri Perlmutter, Ra'anana (IL)

(73) Assignee: Apple Inc., Cupertino, CA (US)

( * ) Notice: Subject to any disclaimer, the term of this patent is extended or adjusted under 35 U.S.C. 154(b) by 1105 days.

(21) Appl. No.: 12/551,583

(22) Filed: Sep. 1, 2009

Related U.S. Application Data

(60) Provisional application No. 61/093,613, filed on Sep. 2, 2008, provisional application No. 61/105,819, filed on Oct. 16, 2008, provisional application No. 61/120,968, filed on Dec. 9, 2008, provisional application No. 61/141,866, filed on Dec. 31, 2008.

(51) Int. Cl.
 *G11C 29/00* (2006.01)
 *G11C 29/04* (2006.01)

(52) U.S. Cl.
 USPC ........... 714/763; 714/764; 714/766; 714/768; 714/773

(58) Field of Classification Search
 None
 See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |
| 4,558,431 A | 12/1985 | Satoh | |
| 4,608,687 A | 8/1986 | Dutton | |
| 4,654,847 A | 3/1987 | Dutton | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |

(Continued)

FOREIGN PATENT DOCUMENTS

| EP | 0783754 B1 | 7/1997 |
|---|---|---|
| EP | 1434236 B1 | 6/2004 |

(Continued)

OTHER PUBLICATIONS

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

(Continued)

*Primary Examiner* — Justin R Knapp
(74) *Attorney, Agent, or Firm* — Meyertons, Hood, Kivlin, Kowert & Goetzel, P.C.

(57) ABSTRACT

A method for data storage includes assigning in a memory that includes one or more storage devices a first storage area for storage of user data, and a second storage area, which is separate from the first storage area, for storage of redundancy information related to the user data. Input data is processed to produce redundancy data, and the input data is stored in the first storage area using at least one first write command. The redundancy data is stored in the second storage area using at least one second write command, separate from the first write command.

20 Claims, 6 Drawing Sheets

(56) References Cited

U.S. PATENT DOCUMENTS

| | | | |
|---|---|---|---|
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,781,472 A * | 7/1998 | Sweha et al. ............. 365/185.11 |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yang et al. |
| 6,442,083 B2 | 8/2002 | Hotaka |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,618,299 B2 | 9/2003 | Sohn et al. |
| 6,621,739 B2 | 9/2003 | Gonzalez et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,662,333 B1 * | 12/2003 | Zhang et al. .................. 714/767 |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |

(56) References Cited

U.S. PATENT DOCUMENTS

| | | | |
|---|---|---|---|
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzalez et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,117,421 B1 * | 10/2006 | Danilak ........................ 714/763 |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzalez et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhlesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,373,562 B2 | 5/2008 | Poechmueller |
| 7,388,781 B2 | 6/2008 | Litsyn et al. |
| 7,397,697 B2 | 7/2008 | So et al. |
| 7,404,137 B2 * | 7/2008 | Lin et al. ........................ 714/768 |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobets et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |

(56) References Cited

U.S. PATENT DOCUMENTS

| | | |
|---|---|---|
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,676,730 B2 * | 3/2010 | Haugan et al. ............ 714/769 |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,975,205 B2 * | 7/2011 | Thayer ............ 714/763 |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,185,801 B2 * | 5/2012 | Dell et al. ............ 714/763 |
| 2001/0002172 A1 | 5/2001 | Tanaka et al. |
| 2001/0006479 A1 | 7/2001 | Ikehashi et al. |
| 2002/0029315 A1 * | 3/2002 | Williams et al. ............ 711/105 |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0037299 A1 * | 2/2003 | Smith ............ 714/763 |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0026347 A1 * | 2/2006 | Hung ............ 711/114 |
| 2006/0028875 A1 | 2/2006 | Avraham et al. |
| 2006/0028877 A1 | 2/2006 | Meir |
| 2006/0059406 A1 * | 3/2006 | Micheloni et al. ............ 714/763 |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 * | 1/2007 | Moshayedi et al. ............ 714/2 |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobets |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |

(56) References Cited

U.S. PATENT DOCUMENTS

| | | |
|---|---|---|
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1* | 11/2008 | Shalvi et al. ............ 714/6 |
| 2008/0288714 A1 | 11/2008 | Salomon et al. |
| 2009/0013233 A1* | 1/2009 | Radke ............ 714/752 |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144598 A1* | 6/2009 | Yoon et al. ............ 714/752 |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0164704 A1* | 6/2009 | Kanade et al. ............ 711/103 |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 11/945,575 Official Action dated Aug. 24, 2010.
U.S. Appl. No. 12/045,520 Official Action dated Nov. 16, 2010.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.

(56) References Cited

OTHER PUBLICATIONS

U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model-5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
US 7,161,836, 1/2007, Wan et al. (withdrawn).
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.

(56) References Cited

OTHER PUBLICATIONS

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{th}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

U.S. Appl. No. 11/949,135 Official Action dated Oct. 2, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

Sommer et al., U.S. Appl. No. 12/497,707 "Data Storage in Analog Memory Cells with Protection Against Programming Interruption" filed Jul. 6, 2009.

Winter et al., U.S. Appl. No. 12/534,898 "Data Storage Using Modified Voltages" filed Aug. 4, 2009.

Winter et al., U.S. Appl. No. 12/534,893 "Improved Data Storage in Analog Memory Cells Using Modified Pass Voltages" filed Aug. 4, 2009.

Shalvi et al., U.S. Appl. No. 12/551,567 "Reliable Data Storage in Analog Memory Cells Subjected to Long Retention Periods" filed Sep. 1, 2009.

U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 131355,536, filed Jan. 22, 2012.

Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.

U.S. Appl. No. 12/019,011 Official Action dated Nov. 20, 2009.

Takeuchi et al., "A Multipage Cell Architecture for High-Speed Programming Multilevel NAND Flash Memories", IEEE Journal of Solid State Circuits, vol. 33, No. 8, Aug. 1998.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

\* cited by examiner

SEGMENTED DATA STORAGE

CROSS-REFERENCE TO RELATED APPLICATIONS

This application claims the benefit of U.S. Provisional Patent Application 61/093,613, filed Sep. 2, 2008, U.S. Provisional Patent Application 61/105,819, filed Oct. 16, 2008, U.S. Provisional Patent Application 61/120,968, filed Dec. 9, 2008, and U.S. Provisional Patent Application 61/141,866, filed Dec. 31, 2008, whose disclosures are incorporated herein by reference.

FIELD OF THE INVENTION

The present invention relates generally to data storage, and particularly to segmented storage of data and redundancy information.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits. Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

Data that is stored in memory is sometimes encoded with an Error Correction Code (ECC) in order to reduce the likelihood of read errors. For example, Goodman and Sayano describe a number of on-chip coding techniques for the protection of Random Access Memory (RAM) devices, which use multi-level storage cells, in "On-Chip ECC for Multi-Level Random Access Memories," Proceedings of the 1989 IEEE/CAM Information Theory Workshop, Jun. 25-29, 1989, Ithaca, N.Y., which is incorporated herein by reference. As another example, U.S. Pat. No. 6,212,654, whose disclosure is incorporated herein by reference, describes methods for storing data in an analog memory device using coded modulation techniques. Other ECC schemes for multilevel memory devices are described in U.S. Pat. No. 6,469,931, whose disclosure is incorporated herein by reference.

U.S. Patent Application Publication 2004/0083333, whose disclosure is incorporated herein by reference, describes techniques for using different ECC algorithms to encode and to decode contents of blocks within a non-volatile memory. U.S. Patent Application Publication 2004/0083334, whose disclosure is incorporated herein by reference, describes techniques for encoding data associated with a page by dividing the page into segments and separately encoding the segments using extended ECC calculations.

SUMMARY OF THE INVENTION

An embodiment of the present invention provides a method for data storage, including:

in a memory that includes one or more storage devices, assigning a first storage area for storage of user data, and a second storage area, which is separate from the first storage area, for storage of redundancy information related to the user data;

processing input data to produce redundancy data;

storing the input data in the first storage area using at least one first write command; and storing the redundancy data in the second storage area using at least one second write command, separate from the first write command.

In some embodiments, the method includes evaluating a criterion with respect to the stored input data, and, responsively to the criterion, selecting to perform one of:

reconstructing the input data irrespective of the redundancy data stored in the second storage area by reading the input data from the first storage area; and reading the redundancy data from the second storage area and reconstructing the input data responsively to the read redundancy data.

In a disclosed embodiment, the criterion includes a success of an attempt to reconstruct the input data by reading the input data from the first storage area irrespective of the redundancy data stored in the second storage area. In an embodiment, processing the input data includes encoding the input data with an Error Correction Code (ECC) to produce parity bits, storing the redundancy data includes storing the parity bits in the second storage area, and reconstructing the input data responsively to the redundancy data includes decoding the ECC.

In another embodiment, processing the input data includes encoding the input data using first and second Error Correction Codes (ECC) to produce respective first and second sets of parity bits, storing the input data includes storing the first set of the parity bits in the first storage area, and storing the redundancy data includes storing the second set of the parity bits in the second storage area. In an embodiment, reconstructing the input data irrespective of the redundancy data includes reading the first set of the redundancy bits from the first storage area and decoding the first ECC, and reconstructing the input data responsively to the read redundancy data includes reading the second set of the redundancy bits from the second storage area and decoding the second ECC.

In another embodiment, evaluating the criterion includes assessing a time period that elapsed since the input data was stored. Additionally or alternatively, evaluating the criterion includes assessing a wear level of memory cells holding the input data. In an embodiment, reading the input data includes accessing the first storage area using at least one first read command, and reading the redundancy data includes accessing the second storage area using at least one second read command, different from the first read command. In yet another embodiment, the memory includes multi-level analog memory cells, each storing at least first and second bits, and reading the redundancy data includes reading the first bits using one or more first read thresholds and reading the second bits using one or more second read thresholds, such that at least a common read threshold is common to the first and second read thresholds, and correcting at least one error in reading the second bits with respect to the common read threshold based on the read first bits.

In some embodiments, assigning the second storage area includes evaluating a criterion with respect to the memory, and modifying a size of the second storage area responsively to the criterion. Evaluating the criterion may include assessing a storage reliability of memory cells in the first storage area. In an embodiment, the method includes storing the redundancy data in the second storage area responsively to detecting that shut-off of electrical power to the memory is imminent. In another embodiment, the memory includes at least first and second storage devices implemented using first and second different storage media types, the first storage area is assigned in the first storage device, and the second storage area is assigned in the second storage device.

There is additionally provided, in accordance with an embodiment of the present invention, apparatus for data storage, including:

an interface, which is coupled to communicate with a memory that includes one or more storage devices; and circuitry, which is configured to assign in the memory a first storage area for storage of user data, to assign in the memory a second storage area, which is separate from the first storage area, for storage of redundancy information related to the user data, to process input data to produce redundancy data, to store the input data in the first storage area using at least one first write command, and to store the redundancy data in the second storage area using at least one second write command, separate from the first write command.

There is also provided, in accordance with an embodiment of the present invention, apparatus for data storage, including:

a memory including one or more storage devices; and circuitry, which is configured to assign in the memory a first storage area for storage of user data, to assign in the memory a second storage area, which is separate from the first storage area, for storage of redundancy information related to the user data, to process input data to produce redundancy data, to store the input data in the first storage area using at least one first write command, and to store the redundancy data in the second storage area using at least one second write command, separate from the first write command.

The present invention will be more fully understood from the following detailed description of the embodiments thereof, taken together with the drawings in which:

DETAILED DESCRIPTION OF EMBODIMENTS

Overview

Figure 1:
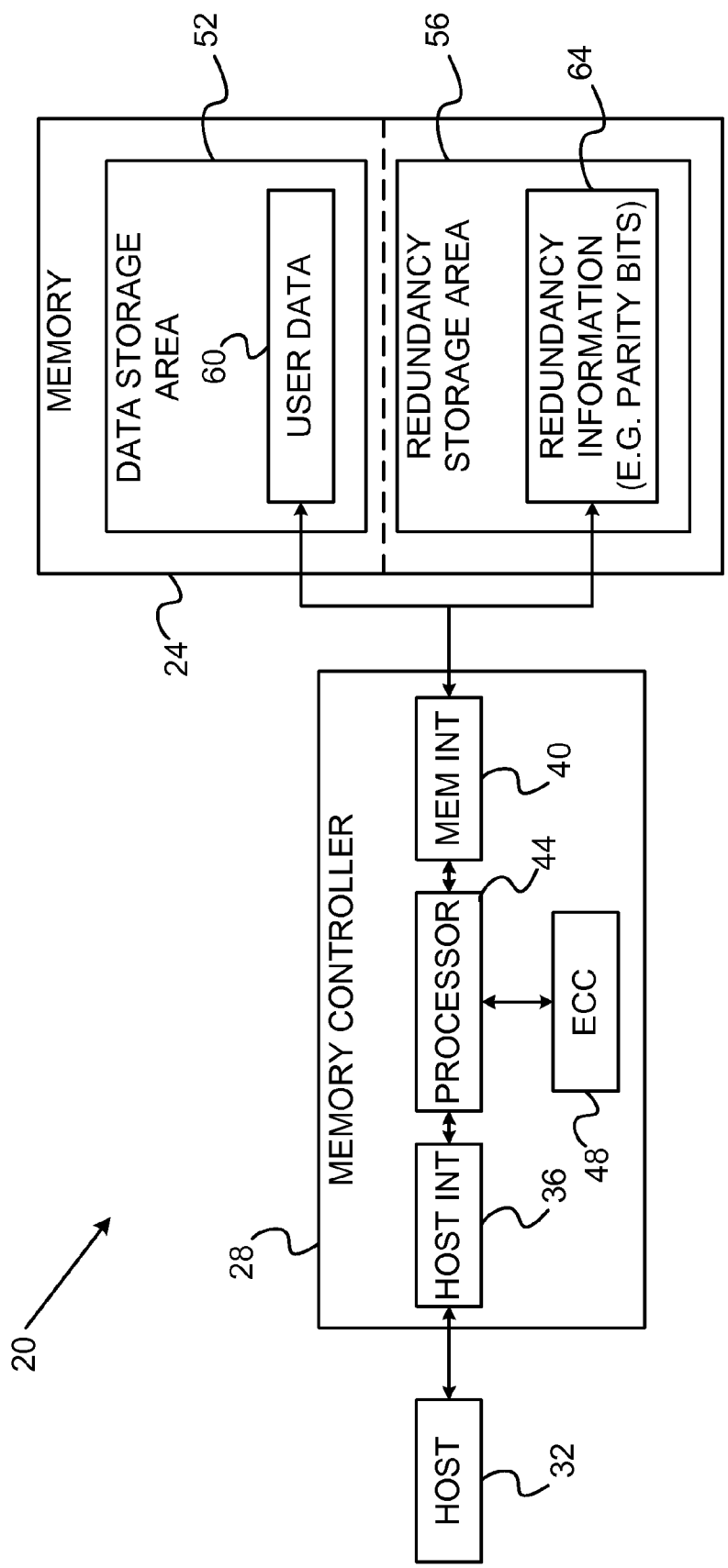
FIG. 1 is a block diagram that schematically illustrates a memory system, in accordance with an embodiment of the present invention.

Embodiments of the present invention that are described hereinbelow provide methods and systems for improving the reliability, latency, cost-effectiveness and operational flexibility of data storage and retrieval. These embodiments refer mainly to Solid-State Disk (SSD) systems, but the disclosed techniques are similarly applicable to various other memory systems and applications.

In some embodiments, a memory is partitioned into a data storage area and a redundancy storage area, separate from one another. The data storage area is used for storing user data, while the redundancy storage area is used for storing redundancy information (e.g., ECC parity bits) related to the user data. Typically, the data storage area and the redundancy storage area are located in different regions of the memory, typically in different physical pages or blocks, or even on different memory devices. In particular, the data storage area and the redundancy storage area are accessed by separate memory access commands (such as read, write and erase commands). When input data is accepted for storage in the memory, the input data is processed to produce redundancy data. The input data is stored in the data storage area and the redundancy data is stored in the redundancy storage area, typically using separate write commands.

Typically, when the input data is to be retrieved from the memory, an attempt is first made to reconstruct the data from the contents of the data storage area, without reading or using the redundancy data stored in the redundancy storage area. If the initial attempt fails, the redundancy data is read from the redundancy storage area. The input data is then reconstructed using both the data read from the data storage area and the redundancy data read from the redundancy storage area. The initial attempt to reconstruct the data without reading the redundancy data may be skipped, for example, if it is known that the memory cells that store the user data are heavily-cycled or have not been refreshed for a long period of time.

In some embodiments, some redundancy bits are stored in the data storage area in addition to the input data. Other redundancy bits are stored, as described above, in the redundancy storage area. For example, the input data may be encoded with two different ECCs, with the parity bits of the first ECC stored in the data storage area, and the parity bits of the second ECC (which is typically stronger) stored in the redundancy storage area. In these embodiments, an attempt is initially made to decode the first ECC (whose parity bits are read together with the input data from the data storage area). If this first decoding attempt fails, the parity bits of the second ECC are read from the redundancy storage area and the second ECC is decoded.

When using the methods and systems described herein, the vast majority of user data is usually read successfully using only the information stored in the data storage area. The additional redundancy information is reverted to only on the rare occasion that the information in the data storage area is severely distorted. The higher latency and computational power associated with reading and decoding the redundancy information is incurred only when actually needed. Thus, the methods and systems described herein enable data readout at low latency without compromising data storage reliability.

System Description

FIG. 1 is a block diagram that schematically illustrates a memory system 20, in accordance with an embodiment of the present invention. System 20 stores data in a memory 24, which comprises one or more storage devices. In the embodiments described herein, memory 24 comprises one or more non-volatile Flash memory devices. In alternative embodiments, however, the storage devices of memory 24 may comprise any other suitable type of memory device, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Additionally or alternatively to non-volatile solid-state memory devices, the storage devices of memory 24 may comprise volatile memory devices such as various types of Random Access Memory (RAM), as well as magnetic storage devices such as Hard Disk Drives (HDD). The different types of storage devices are also referred to herein as different storage media. Generally, memory 24 may comprise one or more storage devices, which may be of the same storage medium or of different media types.

System 20 comprises a memory controller 28, which accepts data from a host 32 and stores it in memory 24, and retrieves data from the memory and provides it to the host. Memory controller 28 comprises a host interface 36 for communicating with host 32, a memory interface 40 for communicating with memory 24, and a processor 44 that processes the stored and retrieved data. In some embodiments, controller 28 encodes the stored data with an Error Correction Code (ECC). In these embodiments, controller 28 comprises an ECC unit 48, which encodes the data before stored in memory 24 and decodes the ECC of data retrieved from the memory. Any suitable type of ECC, such as Bose-Chaudhuri-Hocquenghem (BCH) or Reed-Solomon (RS) codes can be used.

Memory controller 28 assigns a data storage area 52 and a redundancy storage area 56 in memory 24. Data storage area 52 is used for storing user data 60, i.e., data that is accepted for storage from host 32. Redundancy storage area 56, on the other hand, is used for storing redundancy information 64 that is related to the user data. The term "redundancy information" is used to describe any kind of information, which increases the likelihood of successfully reconstructing the stored user data. Redundancy information may comprise, for example, ECC parity bits that are produced by ECC unit 48. Alternatively, the redundancy information may comprise a Cyclic Redundancy Check (CRC), checksum or any other suitable type of redundancy information. (In some embodiments, some redundancy information is also stored in data storage area 52 along with the user data, as will be explained further below.)

The data storage area and the redundancy storage area are typically assigned in separate locations in memory 24, i.e., in different memory pages or blocks of a given storage device, or in different storage devices. In some embodiments, the data storage area can be assigned in a storage device of a given storage medium, and the redundancy storage area in a storage device of a different storage medium. For example, the data storage area may be assigned in a storage medium that is optimized for speed, such as fast MLC memory. The redundancy storage area may be assigned in a storage medium that is optimized for reliability such as SLC memory, or in a storage medium that is optimized for low cost such as MLC memory. In an example implementation, the data storage area may reside in Flash memory while the redundancy storage area resides in a DRAM device or in a RAM drive. Each of the data storage area and the redundancy storage area may comprise a single contiguous storage region, or it may be divided into multiple non-contiguous regions in one or more of the storage devices of memory 24.

Typically, the data storage area and the redundancy storage area are accessed (read, written and/or erased) using separate memory access commands. The commands may differ in form (e.g., when the data storage and redundancy storage areas are assigned in different storage media), or only in address values (e.g., when the data storage and redundancy storage areas are assigned in different regions of the same memory device).

In the description that follows, system 20 comprises a Solid-State Disk (SSD) system that stores data for a host computer. In alternative embodiments, however, system 20 may be used in any other suitable application and with any other suitable host, such as in computing devices, cellular phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

Figure 2:
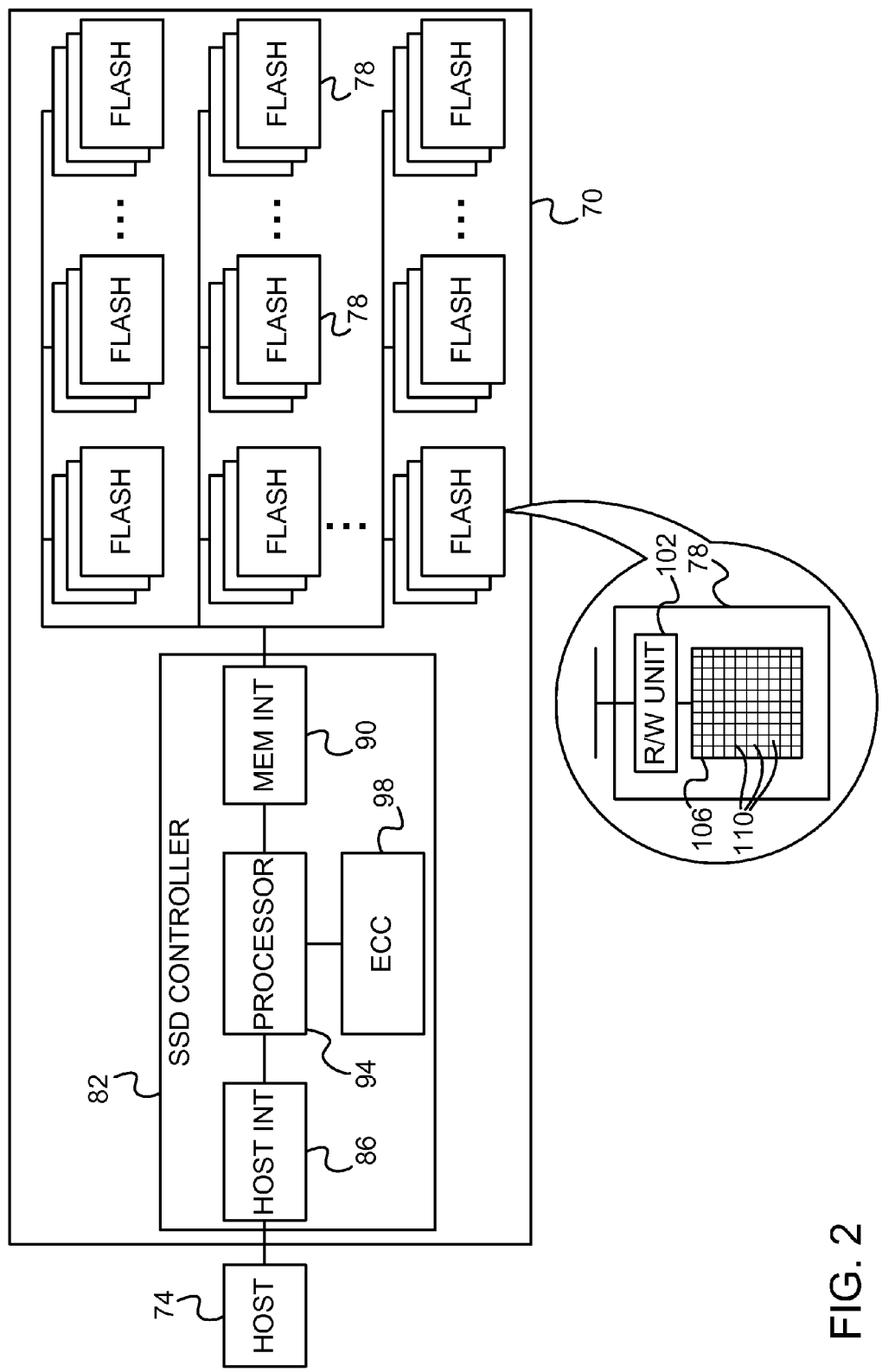
FIG. 2 is a block diagram that schematically illustrates a Solid-State Disk (SSD) system, in accordance with an embodiment of the present invention.

FIG. 2 is a block diagram that schematically illustrates an SSD system 70, in accordance with an embodiment of the present invention. System 70 can be viewed as an example implementation of system 20 of FIG. 1 above. System 70 accepts data for storage from a host 74 and stores it in memory, and retrieves data from memory and provides it to the host. System 70 comprises multiple memory devices 78, each comprising multiple analog memory cells. In the present example, devices 78 comprise non-volatile NAND Flash devices, although any other suitable memory type, such as the memory types described above, can also be used. Each memory device 78 may comprise a packaged device or an unpackaged semiconductor chip or die. A typical SSD may comprise on the order of thirty-two devices, each providing a storage space of 4096 MB. Alternatively, however, system 70 may comprise any suitable number of memory devices of any desired type and size. Although the system configuration of FIG. 2 comprises multiple memory devices, the methods and systems described herein can also be used in systems having only a single memory device.

System 70 comprises an SSD controller 82, which accepts data from host 74 and stores it in memory devices 78, and retrieves data from the memory devices and provides it to the host. SSD controller 82 comprises a host interface 86 for communicating with host 74, a memory interface 90 for communicating with memory devices 78, and a processor 94 that processes the stored and retrieved data. In particular, processor 94 assigns a data storage area and a redundancy storage area in memory devices 78, and carries out the data storage methods described herein using these separate areas. In some embodiments, controller 94 encodes the stored data with an ECC. In these embodiments, controller 82 comprises an ECC unit 98, which encodes the data before stored in devices 78 and decodes the ECC of data retrieved from devices 78.

Each memory device 78 comprises a memory cell array 106. The memory array comprises multiple analog memory cells 110. In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 78 comprises a non-volatile memory of NAND Flash cells.

The charge levels stored in the cells and/or the analog voltages or currents written into and read out of the cells are referred to herein collectively as analog values or storage values. Although the embodiments described herein mainly address threshold voltages (i.e., as is well-known in the art, the gate voltage at which the memory cell begins to conduct), the methods and systems described herein may be used with any other suitable kind of storage values.

System 70 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Each memory device 78 comprises a reading/writing (R/W) unit 102, which accepts data for storage from SSD controller 82, converts the data into analog storage values and writes them into memory cells 110 of that memory device. When reading data out of array 106, R/W unit 102 typically converts the storage values of memory cells 110 into digital samples having a resolution of one or more bits, and provides the digital samples to controller 82. Data is typically written to and read from the memory cells in groups that are referred to as pages. In some embodiments, the R/W unit can erase a group of cells 110 by applying one or more negative erasure pulses to the cells.

Memory controller 28 in FIG. 1 and/or SSD controller 82 in FIG. 2, and in particular processors 44 and/or 94, may be implemented in hardware. Alternatively, controller and/or 82 may comprise a microprocessor that runs suitable software, or a combination of hardware and software elements. In some embodiments, processor 44 and/or 94 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The configurations of FIGS. 1 and 2 are exemplary system configurations, which are shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figures for clarity.

In the exemplary system configuration shown in FIG. 2, memory devices 78 and SSD controller 82 are implemented as separate Integrated Circuits (ICs). In alternative embodiments, however, the memory and the controller (memory 24 and controller 28, or memory devices 78 and controller 82) may be integrated on separate semiconductor dies in a single Multi-Chip Package (MCP) or System on Chip (SoC), and may be interconnected by an internal bus. Further alternatively, some or all of the controller circuitry may reside on the same die on which one or more of the memory devices are disposed. Further alternatively, some or all of the functionality of the controller can be implemented in software and carried out by a processor or other element of the host system. In some embodiments, the host and the controller may be fabricated on the same die, or on separate dies in the same device package.

In an example configuration, memory cells 110 in a given array 106 are arranged in multiple rows and columns. The memory cells in each row are connected by word lines, and the memory cells in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of thirty-two word lines, each comprising several thousand cells. Each word line of such a device is often partitioned into four pages (odd/even order cells, least/most significant bit of the cells). Three-bit-per cell devices having thirty-two word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Data Storage and Retrieval in Data Storage Area and Redundancy Storage Area

Storing user data in one area and redundancy data in another area is advantageous for several reasons. For example, in many cases the user data can be reconstructed successfully without fetching or using the redundancy information at all. When the user data and redundancy information are stored separately and read by separate read commands, it is often sufficient to read only the data storage area in order to retrieve the user data. The average number of read commands is thus reduced considerably, along with the latency and computational complexity associated with reading and decoding the redundancy information. An example method that uses this principle is shown in FIG. 3 below.

Moreover, separate storage of user data and redundancy information may be advantageous even if the redundancy information is read and used unconditionally. For example, the data structure in some memory devices (e.g., page size) limits the ability to encode the user data with high-redundancy (e.g., low-rate) ECC. Since most memory devices have a fixed page size, the efficiency of using variable-rate ECC is often limited. Storing the redundancy information in a separate area enables the use of high-redundancy ECC and efficient utilization of memory space. In some cases, storage of user data and redundancy information has different performance requirements, which are better met by different storage media. Separated storage enables storing each of the user data and the redundancy information in a storage medium that best matches its specific requirements.

Figure 3:
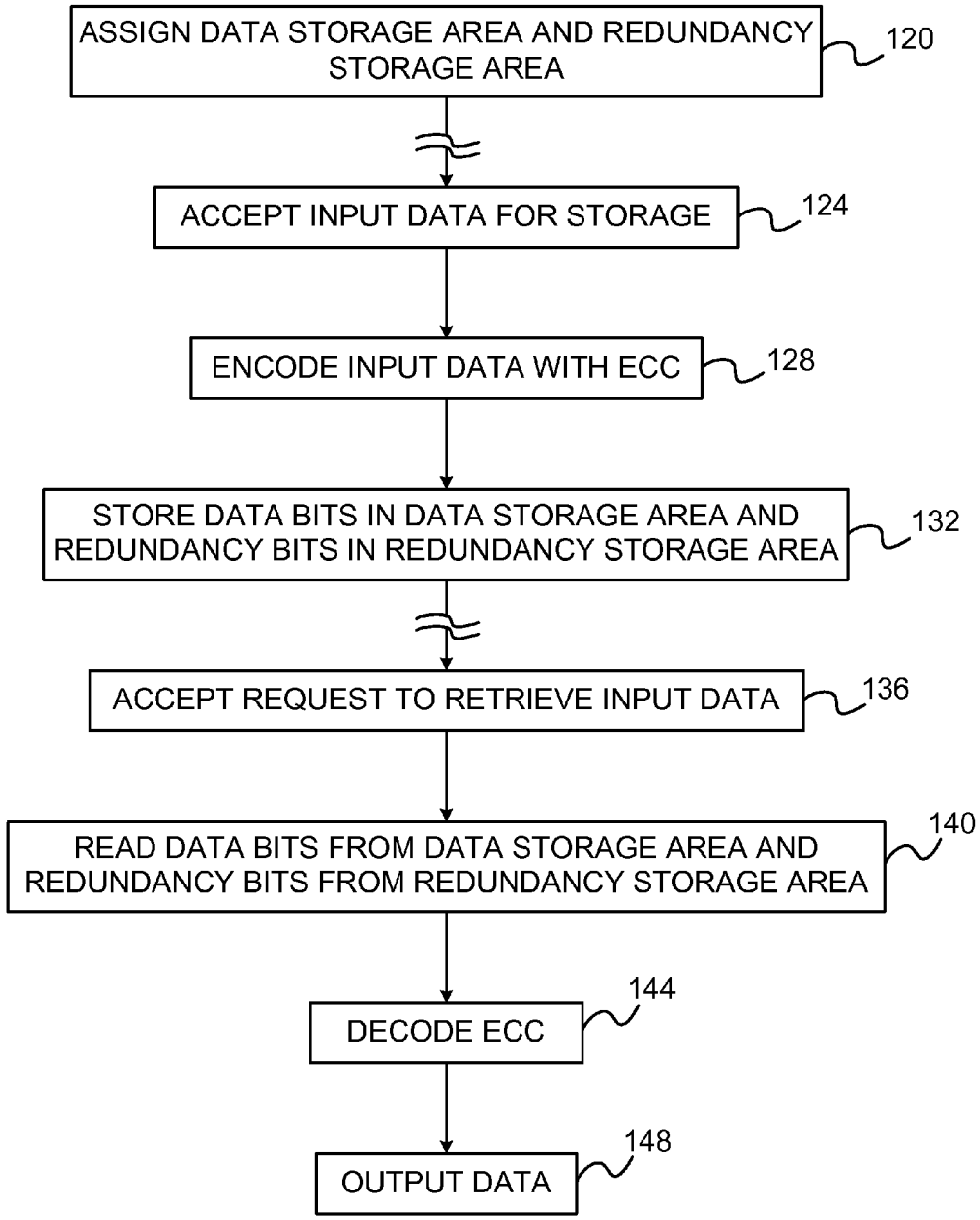
FIGS. 3 and 4 are flow charts that schematically illustrate methods for data storage and retrieval, in accordance with embodiments of the present invention.

FIG. 3 is a flow chart that schematically illustrates a method for data storage and retrieval, in accordance with an embodiment of the present invention. Although the method description refers to system 20 of FIG. 1 above, the method may be applied to any other suitable system configuration, such as SSD system 70 of FIG. 2.

The method of FIG. 3 begins with memory controller 28 assigning data storage area 52 and redundancy storage area 56 in memory 24, at a partitioning step 120. At some point in time, memory controller 28 accepts certain input data for storage, at an input step 124. The input data comprises data bits. The memory controller encodes the data bits of the input data with an ECC, using ECC unit 48, at an encoding step 128. The ECC encoding operation produces parity bits, also referred to as redundancy bits. The memory controller stores the data bits in data storage area 52, and the redundancy bits in redundancy storage area 56, at a storage step 132. The controller typically stores the data bits using one or more write commands that address the data storage area, and the redundancy bits using one or more other write commands that address the redundancy storage area.

At a certain point in time, memory controller 28 accepts from host 32 a request to retrieve the input data, at a retrieval request step 136. In response to the request, the memory controller reads the data bits of the input data from data storage area 52, and the corresponding redundancy bits from redundancy storage area 56, at a readout step 140. The controller typically reads the data bits using one or more read commands that address the data storage area, and the redundancy bits using one or more other read commands that address the redundancy storage area.

ECC unit 48 of memory controller 28 processes the retrieved data bits and redundancy bits so as to decode the ECC, at an ECC decoding step 144. The decoding operation reconstructs the input data. The memory controller outputs the reconstructed data to the host, at an output step 148.

Figure 4:
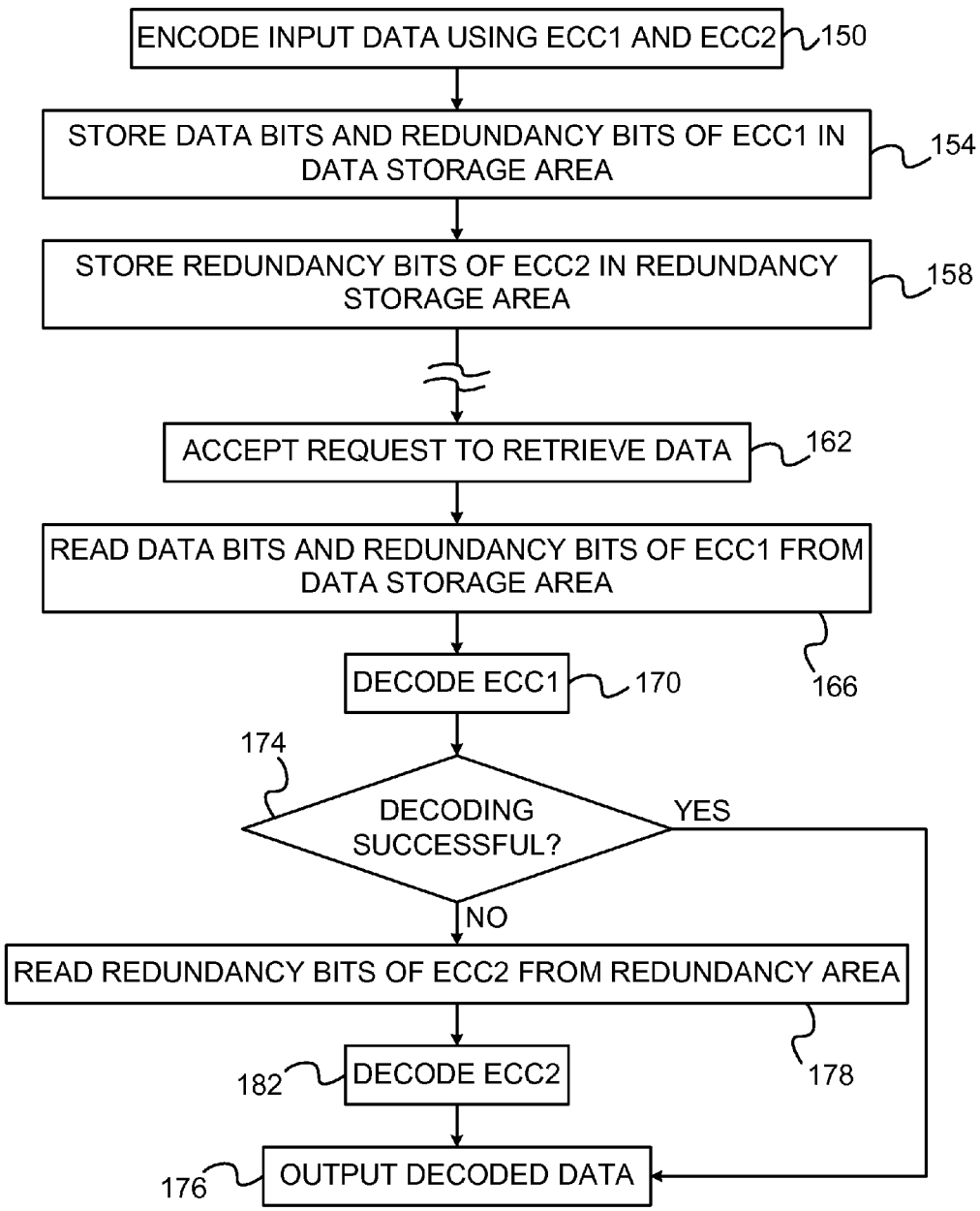

FIG. 4 is a flow chart that schematically illustrates another method for data storage and retrieval, in accordance with an alternative embodiment of the present invention. Although the method description refers to system 20 of FIG. 1 above, the method may be applied to any other suitable system configuration, such as SSD system 70 of FIG. 2.

The method of FIG. 4 begins with ECC unit 48 of memory controller 28 encoding the data bits of certain input data with two alternative ECCs denoted ECC1 and ECC2, at a dual encoding step 150. Typically, ECC2 is stronger (e.g., has a lower code rate) than ECC1, and as a result produces a larger number of redundancy bits for a given set of data bits.

The memory controller stores the data bits and the redundancy bits of ECC1 in data storage area 52, at a first storage step 154. The memory controller stores the redundancy bits of ECC2 in redundancy storage area 56, at a second storage step 158. Typically, the memory controller carries out step 154 using one or more write commands that address the data storage area, and step 158 using one or more other write commands that address the redundancy storage area.

The memory controller accepts a request to retrieve the data in question, at a readout request step 162. In response to the request, the memory controller first attempts to reconstruct the data using only the information stored in the data storage area (i.e., based on ECC1). The memory controller reads the data bits and the redundancy bits of ECC1 from the data storage area, at a first readout step 166. ECC unit 48 attempts to decode ECC1, at an ECC1 decoding step 170. If the attempt to decode ECC1 is successful, the memory controller outputs the reconstructed data to the host, at a data output step 176, and the method terminates.

Otherwise, i.e., if the attempt to decode ECC1 fails, the memory controller reads the redundancy bits of ECC2 from redundancy storage area 56, at a second readout step 178. ECC unit 48 then decodes ECC2, at an ECC2 decoding step 182. Since ECC2 is stronger than ECC1, ECC2 decoding is likely to succeed even though ECC1 decoding (step 170) has failed. Memory controller 28 then outputs the reconstructed data to the host, at step 176.

In the method of FIG. 4, the memory controller accesses the redundancy storage area selectively, only when the data cannot be reconstructed based on the information stored in the data storage area. This feature, as explained above, significantly reduces the average number of read operations carried out by the memory controller. As a result, the average read latency is considerably lower. Since ECC2 typically comprises a low-rate code, its decoding is often a computationally-intensive and time-consuming task, and therefore the reduction in read latency achieved by the method of FIG. 4 is particularly important.

Another feature of the method of FIG. 4 is that some redundancy information is stored in the data storage area in addition to the data bits. This technique increases the likelihood of succeeding to reconstruct the data in the initial attempt (i.e., without reverting to the redundancy storage area). On the other hand, this technique increases the average read latency, because ECC1 is decoded in any readout operation. Since ECC1 is typically selected to be a relatively high-rate code (which produces a relatively small number of parity bits), the latency increase is usually tolerable.

Note that in some embodiments, the redundancy storage area can be accessed selectively (i.e., only upon failure to reconstruct the data using the data storage area) even if no redundancy information is stored in the data storage area.

Alternatively to using ECC1, the memory controller may store other forms of redundancy information in the data storage area. For example, the memory controller may compute an error detection code (e.g., a Cyclic Redundancy Check (CRC) or checksum) over the data bits, and store the result in the data storage area. When reading the data, the memory controller may evaluate the error detection code in order to decide whether or not to revert to the redundancy storage area.

The example of FIG. 4 describes two levels of redundancy, namely ECC1 and ECC2. Alternatively, however, the memory controller may apply three or more levels of redundancy, each stored and retrieved separately. In these embodiments, the memory controller gradually increases the level of redundancy if the previous attempt fails.

In the description above, the second decoding attempt (step 182) uses the redundancy bits stored in the redundancy storage area, and not the redundancy bits stored in the data storage area. In alternative embodiments, however, the second decoding attempt may consider the redundancy bits stored both in the redundancy storage area and in the data storage area. This technique is sometimes referred to as incremental encoding. Some aspects of incremental encoding are addressed in U.S. Patent Application Publication 2008/0282106, which is assigned to the assignee of the present patent application and whose disclosure is incorporated herein by reference.

Variable-Size Redundancy Storage Area

In some embodiments, memory controller 28 modifies the size of the redundancy storage area dynamically over the lifetime of memory 24. The memory controller may adjust the size of the redundancy storage area based on any suitable criterion related to the memory, such as based on the estimated storage reliability of the memory cells in the data storage area. The memory controller may estimate the storage reliability, for example, depending on the number of programming and erasure cycles the cells have gone through. This estimate is based on the assumption that fresh memory cells have higher storage reliability than heavily-cycled memory cells.

As another example, when the system is subject to long power shut-off periods, memory controller 28 may increase the size of the redundancy storage area and apply sufficient redundancy to maintain data reliably during power shut-off. When power shut-off periods are not anticipated, a smaller redundancy storage area may be sufficient. The size of the redundancy storage area can also be adjusted depending on whether advance notification of power shut-off is available.

As yet another example, the storage reliability in memory 24 may be user-configurable or otherwise pre-specified. In such cases, the memory controller may adjust the size of the redundancy storage area (and the amount of redundancy) to match the specified reliability level, thus effectively trading memory space for reliability. Additionally or alternatively, any other suitable criteria can be used to set the size of the redundancy storage area.

Figure 5:
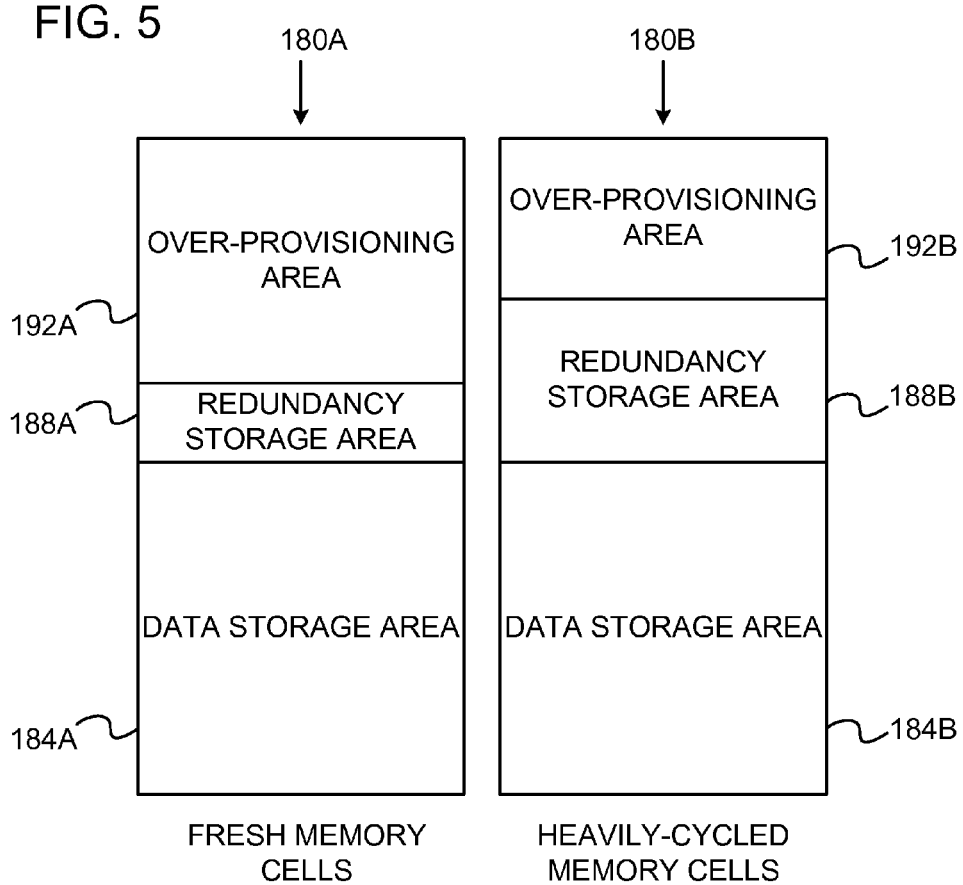
FIG. 5 is a diagram showing memories partitioned into data storage, redundancy storage and over-provisioning areas, in accordance with an embodiment of the present invention.

FIG. 5 is a diagram showing memory arrays partitioned into data storage, redundancy storage and Over-Provisioning (OP) areas, in accordance with an embodiment of the present invention. In the example of FIG. 5, a memory 180A is partitioned (statically or dynamically) into a data storage area 184A, a redundancy storage area 188A and an OP area 192A. A memory 180B is partitioned into a data storage area 184B, a redundancy storage area 188B and an OP area 192B. Memory 180A represents a situation in which the memory cells are relatively fresh, i.e., have gone through a relatively small number of programming and erasure cycles. Memory 180B represents a situation in which the memory cells are heavily cycled, i.e., have gone through a relatively large number of programming and erasure cycles. Memories 180A and 180B may correspond to different groups of memory cells. Alternatively, Memory 180B may correspond to the same group of memory cells as memory 180A, but at a later point in time.

The functions of the data storage areas (184A and 184B) and the redundancy storage areas (188A and 188B) have been described above. The OP areas (192A and 192B) are typically used as dynamic cache memories, for performing random (i.e., non-sequential) write operations more efficiently.

When the memory cells are relatively fresh, reliable storage can be achieved using a modest amount of redundancy information. The memory controller thus sets the size of redundancy storage area 188A accordingly. When the memory cells become heavily-cycled, their storage reliability deteriorates, and additional redundancy may be needed in order to maintain reliable storage. Therefore, the memory controller sets the size of redundancy storage area 188B to be larger than the size of area 188A. In the present example, increasing the size of the redundancy storage area comes at the expense of reducing the size of the OP area, i.e., at the expense of degraded random write performance.

Figure 6:
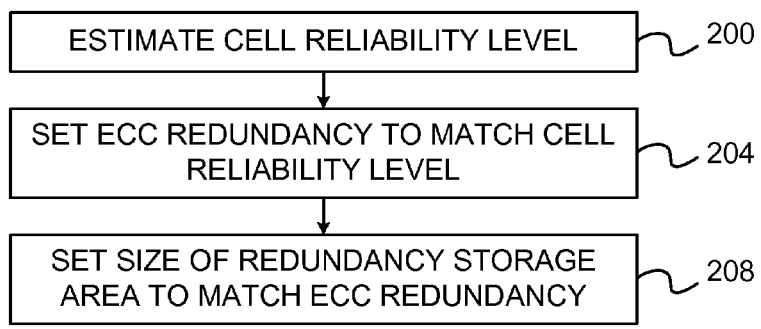
FIG. 6 is a flow chart that schematically illustrates a method for allocating redundancy storage space, in accordance with an embodiment of the present invention.

FIG. 6 is a flow chart that schematically illustrates a method for allocating redundancy storage space, in accordance with an embodiment of the present invention. The method begins with memory controller 28 estimating the storage reliability of a group of memory cells, at a reliability estimation step 200. For example, the memory controller may estimate the storage reliability based on the number of programming and erasure cycles applied to the memory cells. The memory controller sets the ECC redundancy (e.g., the ECC code rate) based on the estimated storage reliability, at a redundancy setting step 204. The memory controller then sets the size of the redundancy storage area based on the ECC redundancy level, at a redundancy area setting step 208.

Some aspects of estimating the storage reliability of memory cells and of using variable redundancy levels are addressed in U.S. patent application Ser. No. 12/063,544, entitled "Memory Device with Adaptive Capacity," which is assigned to the assignee of the present patent application and whose disclosure is incorporated herein by reference.

Data Storage in the Presence of Power Shut-Off Events

In some data storage applications, system 20 experiences power shut-off events. Power shut-offs are common, for example, in removable storage devices that accept electrical power from a host, such as SSD systems (e.g., system 70 in FIG. 2), Disk-On-Keys (DOK) and removable memory cards. A device of this sort experiences power shut-off whenever it is disconnected from the host. Power shut-off periods have a detrimental effect on the storage reliability of analog memory cells, because the storage values of some memory cells may undergo considerable distortion by the time electrical power is restored. This distortion may cause significant performance degradation.

In some embodiments of the present invention, system 20 identifies that power shut-off is imminent, such as by accepting an indication from the host. Upon detecting that power shut-down is imminent, the memory controller re-programs at least some of the data in the memory using a different storage configuration, which is more robust to long retention periods. For example, the robust storage configuration may use an ECC having higher redundancy than the ECC used for normal storage. Some aspects of data storage in the presence of power shut-down events are addressed in detail in U.S. patent application Ser. No. 12/551,567, entitled "Reliable Data Storage in Analog Memory Cells Subjected to Long Retention Periods," filed Sep. 1, 2009, which is assigned to the assignee of the present patent application and whose disclosure is incorporated herein by reference.

In some embodiments, the memory controller stores the redundancy bits of the ECC, which is used in the normal storage configuration, in the data storage area. The redundancy bits of the higher-redundancy ECC, which is used in the robust storage configuration, are stored in the redundancy storage area. Using this technique, the normal storage configuration has relatively low read latency.

Figure 7:
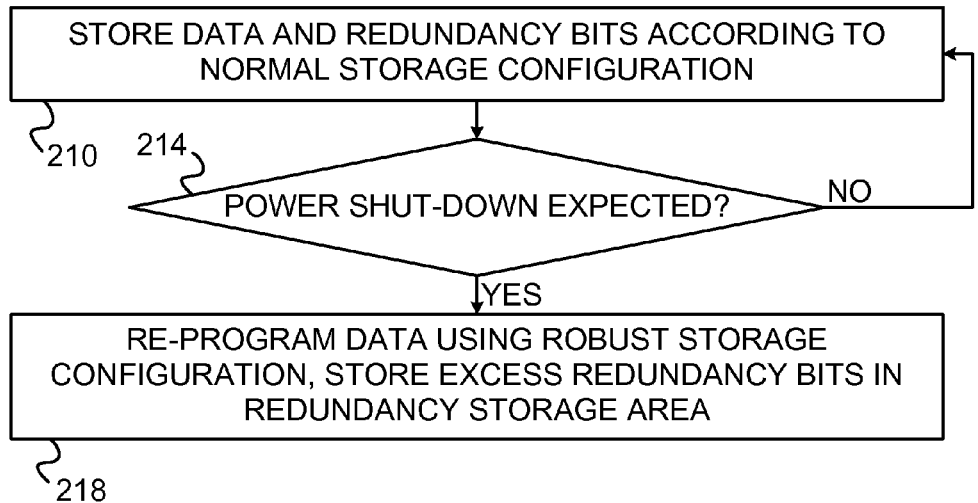
FIG. 7 is a flow chart that schematically illustrates a method for data storage in the presence of power shut-down, in accordance with an embodiment of the present invention.

FIG. 7 is a flow chart that schematically illustrates a method for data storage in the presence of power shut-down, in accordance with an embodiment of the present invention. The method begins with the memory controller storing data in the memory using the normal storage configuration, at a normal storage step 210. The memory controller checks whether power shut-down is imminent, at a checking step 214. If no power shut-down is expected, the method loops back to step 210 above.

Otherwise, i.e., upon detecting that power shut-down is imminent, the memory controller re-programs at least some of the data using the robust storage configuration, at a robust re-programming step 218. The robust storage configuration uses an ECC whose code rate is lower than the ECC used in the normal storage configuration. When re-programming the data, the memory controller stores the redundancy bits of the lower-rate ECC in the redundancy storage area.

Segmented Data Storage in Memory Devices Having Binary Bit Mapping

As explained above, analog memory cell devices (e.g., Flash devices) store data in analog memory cells by writing analog storage values into the cells. The range of storage values (e.g., charge levels or threshold voltages) is divided into intervals that represent possible data values. Each such interval is referred to as a programming state or programming level. R/W unit 102 (FIG. 2) programs a given memory cell to store a certain data value by writing a storage value that falls in the range corresponding to that data value. The R/W unit typically reads a given memory cell by comparing its storage value to one or more read thresholds, which are usually positioned in the boundary regions between adjacent programming levels.

In multi-level memory cell devices, each memory cell stores two or more data bits, and each programming level corresponds to a particular value combination of these two or more bits. When using four-level memory cells, for example, each memory cell stores two data bits. The bits are commonly referred to as a Least Significant Bit (LSB) and a Most Significant Bit (MSB), although this terminology is arbitrary and any other suitable terminology can also be used. In some embodiments, the memory controller stores multiple memory pages in a group of multi-level memory cells (e.g., the cells in a given word line), such that different bits store different pages. In four-level cells, for example, the memory controller may store a certain memory page in the cell LSBs and another page in the cell MSBs. Each bit (page) is read using a respective set of one or more read thresholds.

Multi-level memory devices may differ from one another in the way bit values are mapped to programming levels. Two common mapping schemes are Gray mapping and binary mapping. In Gray mapping, adjacent programming levels differ from one another by only one bit value. Since most read errors occur between adjacent programming levels, Gray mapping ensures that each error event affects only a single bit, and therefore reduces the overall error probability. In binary mapping, bit values are mapped to programming levels in an ascending or descending binary order. As a result, some error events between adjacent programming levels affect more than a single bit. Thus, binary mapping is usually inferior to Gray mapping in terms of read error performance.

Figure 8:
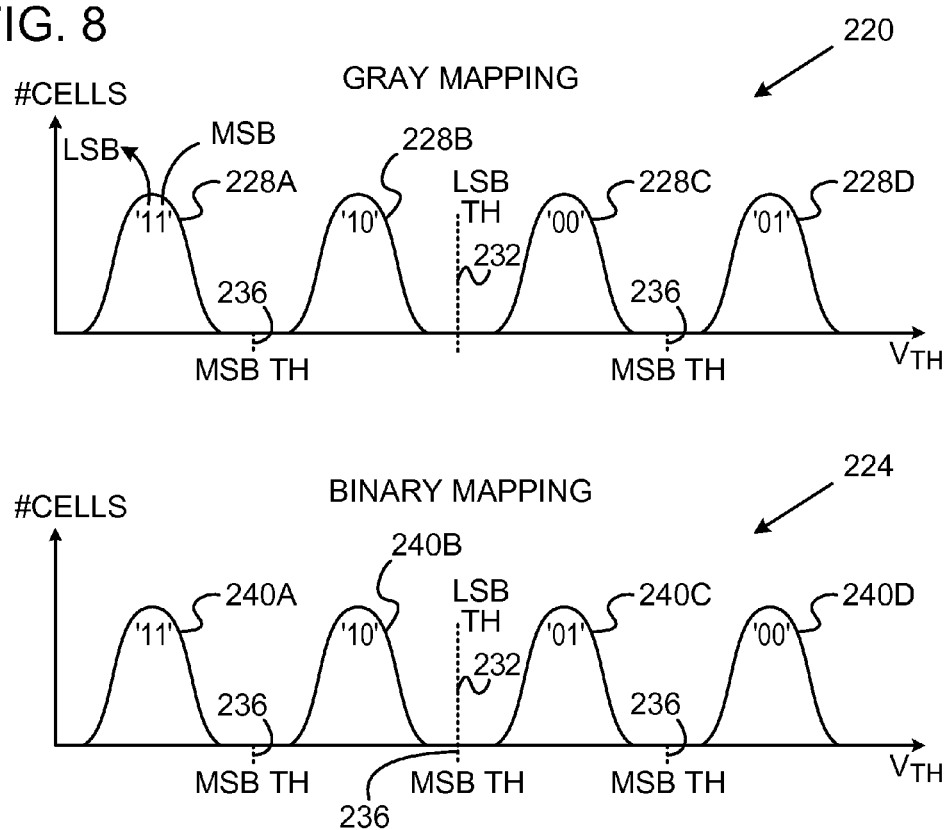
FIG. 8 is a graph showing threshold voltage distributions in groups of analog memory cells, in accordance with an embodiment of the present invention.

FIG. 8 is a graph showing Gray mapping and binary mapping of bit values to programming levels, in accordance with an embodiment of the present invention. The example of FIG. 8 refers to four-level MLC, each storing two data bits. A graph 220 at the top of the figure shows the threshold voltage distribution in a group of memory cells that are programmed using Gray mapping. A graph 224 at the bottom of the figure shows the threshold voltage distribution in a group of memory cells that are programmed using binary mapping.

When using Gray mapping (graph 220), four programming levels 228A . . . 228D represent the bit value combinations "11", "10", "00" and "01", respectively. (In this example, the left-hand-side bit denotes the LSB and the right-hand-side bit denotes the MSB.) As can be seen in the figure, adjacent programming levels differ from one another by only one bit value. In order to read the LSBs of these cells, R/W unit uses an LSB read threshold 232, positioned between levels 228B and 228C. The MSBs are read using two MSB read thresholds 236, positioned between levels 228A and 228B and between levels 228C and 228D. Note that in Gray mapping, no read threshold is common to the LSB and MSB.

When using binary mapping (graph 224), four programming levels 240A . . . 240D represent the bit value combinations "11", "10", "01" and "00", respectively. In this scheme, the R/W unit reads the LSB using an LSB read threshold positioned between levels 240B and 240C. The MSB is read using three MSB read thresholds 236, positioned between levels 240A and 240B, between levels 240B and 240C, and between levels 240C and 240D. In the binary mapping scheme, error events between programming levels 240B and 240C (i.e., erroneously deciding that a cell that was programmed to level 240B belongs to level 240C, or vice versa) causes both an LSB error and an MSB error. Therefore, the error performance of this scheme is inferior to the Gray mapping scheme. Note also that in the binary scheme there is some commonality between the LSB and MSB read threshold. In the example of graph 224, the read threshold between programming levels 240B and 240C (referred to as "the middle read threshold") is common to both LSB and MSB readout.

In some embodiments, when using memory devices that use binary mapping, the memory controller compensates for the inferior error performance by re-using information from the readout of one bit (page) in the readout of another bit (page). Information re-use across different bits (pages) is possible because of the commonality between read thresholds.

Consider, for example, the binary mapping scheme of graph 224. Assume that the LSB page was decoded successfully (after error correction). Typically, some of the read LSB values were erroneous but were corrected by the ECC. Erroneous LSB readout is caused by a storage value falling on the wrong side of the middle read threshold (i.e., by a cell that belongs to level 240C but whose threshold voltage fell below the middle read threshold, or by a cell that belongs to level 240B but whose threshold voltage fell above the middle read threshold). The memory controller can identify the memory cells in which the LSB was read incorrectly, since these errors were corrected by the ECC.

Since the middle read threshold is common to both LSB and MSB readout, a memory cell in which the LSB was read incorrectly also corresponds to an MSB error. Therefore, in some embodiments, the memory controller identifies the memory cells in which the LSB was read incorrectly, and flips (reverses) the MSB value of these memory cells. Assuming the MSB errors are distributed uniformly among the three MSB read thresholds, this flipping operation corrects approximately a third of the MSB errors.

As can be appreciated, the re-using information from one page in the readout of another page involves additional computations and incurs additional latency. In some embodiments, the memory controller may invoke this re-use mechanism only when reverting to the redundancy storage area, i.e., only if an initial attempt to reconstruct the data based on the data storage area (without re-use across different pages) fails.

The example embodiments shown in FIG. 8 correspond to four-level memory cells. In alternative embodiments, however, the disclosed technique can be applied in memory cells storing any other suitable number of programming levels, such as eight-level or sixteen-level memory cells.

Conditional Use of the Redundancy Storage Area Based on Cell Refreshing Ad Other Criteria In some embodiments, the memory controller refreshes the data in the memory cells, on a periodic basis or otherwise. Refreshing a group of memory cells (e.g., a block) typically involves copying the data stored in the memory cells to another storage location (e.g., to another block). Occasional cell refreshing avoids long retention periods, in which the cell storage values may drift considerably and cause read errors. Refreshing schemes for analog memory cells are described, for example, in U.S. Pat. Nos. 6,731,557 and 7,397,697, whose disclosures are incorporated herein by reference.

In some embodiments, the memory controller may hold information as to the refreshing status of different memory cells or cell groups (e.g., blocks). The memory controller may use this information to decide whether or not to access and use the redundancy information stored in the redundancy storage area. For example, the memory controller may decide to reconstruct certain user data based on both the data storage area and the redundancy storage area if the memory cells that store this data (in the data storage area) have not been refreshed for longer than a predefined time period.

In particular, if the memory controller concludes that the memory cells that store certain data were not refreshed for a long time period (i.e., that a long time period has elapsed since the data was stored or re-programmed), it may decide to skip any initial attempt to reconstruct the data based on only the data storage area. This feature assumes that such an initial attempt is likely to fail because the memory cells in question are not sufficiently fresh.

Additionally or alternatively, the memory controller may decide whether or not to fetch and use the redundancy information stored in the redundancy storage area based on any other suitable criterion, such as based on the estimated cell wear level (e.g., the number of programming and erasure cycles that the cells have gone through).

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
estimating reliability of one or more multi-level memory cells in a memory, wherein the estimating the reliability includes determining a number of program and erase cycles that have been performed on the one or more multi-level memory cells;
partitioning the memory into a first storage area and a second storage area dependent upon the estimated reliability;
processing input data to produce first redundancy data and second redundancy data, wherein the second redundancy data incudes a larger number of redundancy bits than the first redundancy data;
storing the input data and the first redundancy data in the first storage area, wherein storing the input data includes mapping bit values of the input data to programming levels in a binary order;
storing the second redundancy data in the second storage area; and
evaluating a criterion with respect to the stored input data, and, responsively to the criterion, selecting to perform one of:
reconstructing the input data irrespective of the second redundancy data stored in the second storage area by reading the input data from the first storage area; and
reading the second redundancy data from the second storage area and reconstructing the input data responsively to the second redundancy data;
wherein reconstructing the input data responsively to the second redundancy data comprises reusing readout data from a first page of the stored input data in a reading of a second page of the stored input data.

2. The method according to claim 1, wherein the criterion comprises a success of an attempt to reconstruct the input data by reading the input data and the first redundancy data from the first storage area irrespective of the second redundancy data stored in the second storage area.

3. The method according to claim 1, wherein processing the input data to produce the first redundancy data and the second redundancy data comprises encoding the input data using first and second Error Correction Codes (ECC) to produce respective first and second sets of parity bits, wherein storing the input data and the first redundancy data comprises storing the first set of the parity bits in the first storage area, and wherein storing the second redundancy data comprises storing the second set of the parity bits in the second storage area.

4. The method according to claim 3, wherein reconstructing the input data irrespective of the second redundancy data comprises reading the first set of the parity bits from the first storage area and decoding the first ECC, and wherein reconstructing the input data responsively to the second redundancy data comprises reading the second set of the parity bits from the second storage area and decoding the second ECC.

5. The method according to claim 1, wherein evaluating the criterion comprises assessing a time period that elapsed since the input data was stored.

6. The method according to claim 1, wherein evaluating the criterion comprises assessing a wear level of memory cells holding the input data.

7. The method according to claim 1, wherein reading the input data and the first redundancy data comprises accessing the first storage area, and wherein reading the second redundancy data comprises accessing the second storage area.

8. The method according to claim 1, wherein each multi-level memory cell is configured to store at least a first bit and a second bit, and wherein reading the first redundancy data comprises reading the first bit using one or more first read thresholds and reading the second bit using one or more second read thresholds, such that at least a common read threshold is common to the first and second read thresholds, and correcting at least one error in reading the second bit with respect to the common read threshold based on the read first bit.

9. The method according to claim 1, wherein storing the input data and the first redundancy data in the first storage area comprises programming at least one multi-level memory cell included in the first storage area dependent upon the input data and the first redundancy data using a first storage configuration; and wherein storing the second redundancy data in the second storage area comprises programming at least one multi-level analog memory cell included in the second storage area dependent upon the second redundancy data using the first storage configuration; and the method further comprising detecting that shut-off of electrical power to the memory is imminent, and re-programming the at least one multi-level memory cell included in the first storage area and the at least one multi-level memory cell included in the second storage area using a second storage configuration.

10. The method according to claim 1, wherein the memory includes at least first and second storage devices implemented using first and second different storage media types, wherein the first storage area is assigned in the first storage device, and wherein the second storage area is assigned in the second storage device.

11. An apparatus for data storage, comprising:
an interface, which is coupled to communicate with a memory; and
circuitry coupled to the memory, wherein the circuitry is configured to:
estimate reliability of one or more multi-level memory cells in the memory, wherein to estimate the reliability of the one or more multi-level memory cells in the memory, the circuitry is further configured to determine a number of program and erase cycles that have been performed on the one or more multi-level memory cells;
partitioning the memory into a first storage area and a second storage area dependent upon the estimated reliability;

process input data to produce first redundancy data and second redundancy data, wherein the second redundancy data includes a larger number of redundancy bits than the first redundancy data;

store the input data and the first redundancy data in the first storage area;

wherein to store the input data the circuitry is further configured to map bit values of the input data to programming levels in a binary order;

store the second redundancy data in the second storage area; and evaluate a criterion with respect to the stored input data, and, responsively to the criterion, selecting to perform one of:

reconstruct the input data irrespective of the second redundancy data stored in the second storage area by reading the input data from the first storage area; and read the second redundancy data from the second storage area and reconstructing the input data responsively to the second redundancy data;

wherein to reconstruct the input data responsively to the read second redundancy data the circuitry is further configured to reuse readout data from a first page of the stored input data in a reading of a second page of the stored input data.

12. The apparatus according to claim 11, wherein the criterion comprises a success of an attempt to reconstruct the input data by reading the input data and the first redundancy data from the first storage area irrespective of the second redundancy data stored in the second storage area.

13. The apparatus according to claim 11, wherein to process the input data to produce the first redundancy data and the second redundancy data, the circuitry is further configured to encode the input data using first and second Error Correction Codes (ECC) to produce respective first and second sets of parity bits, and to store the first set of the parity bits in the first storage area and to store the second set of the parity bits in the second storage area.

14. The apparatus according to claim 13, wherein the circuitry is further configured to reconstruct the input data irrespective of the second redundancy data by reading the first set of the parity bits from the first storage area and decoding the first ECC, and to reconstruct the input data responsively to the second redundancy data by reading the second set of the parity bits from the second storage area and decoding the second ECC.

15. The apparatus according to claim 11, wherein the circuitry is further configured to evaluate the criterion by assessing a time period that elapsed since the input data was stored.

16. The apparatus according to claim 11, wherein the circuitry is further configured to evaluate the criterion by assessing a wear level of the one or more multi-level memory cells holding the input data.

17. The apparatus according to claim 11, wherein to store the input data in the first storage area the circuitry is further configured to store the input data and the first redundancy data in the first storage area using at least one first write command, and wherein to store the second redundancy data in the second storage area the circuitry is further configured to store the second redundancy data in the second storage area using at least one second write command, different from the first write command.

18. The apparatus according to claim 11, wherein each multi-level memory cell is configured to store at least a first bit and a second bit, and wherein the circuitry is configured to read the first bit using one or more first read thresholds, to read the second bit using one or more second read thresholds such that at least a common read threshold is common to the first and second read thresholds, and to correct at least one error in reading the second bit with respect to the common read threshold based on the read first bit.

19. The apparatus according to claim 11, wherein to store the input data and the first redundancy data in the first storage area, the circuitry is further configured to program at least one multi-level memory cell included in the first storage area dependent on the input data and the first redundancy data using a first storage configuration; and wherein to store the second redundancy data in the second storage area, the circuitry is further configured to program at least one multi-level memory included in the second storage area dependent upon the second redundancy data using the first storage configuration; and wherein the circuitry is further configured to detect that shut-off of electrical power to the memory is imminent, and to re-program the at least one multi-level memory cell of the first storage area and the at least one multi-level memory cell of the second storage area using a second storage configuration responsive to the detection of the shut-off.

20. The apparatus according to claim 11, wherein the memory includes at least first and second storage devices implemented using first and second different storage media types, and wherein the circuitry is configured to assign the first storage area in the first storage device and to assign the second storage area in the second storage device.

\* \* \* \* \*

UNITED STATES PATENT AND TRADEMARK OFFICE
CERTIFICATE OF CORRECTION

PATENT NO. : 8,949,684 B1  
APPLICATION NO. : 12/551583  
DATED : February 3, 2015  
INVENTOR(S) : Ofir Shalvi et al.

Page 1 of 1

It is certified that error appears in the above-identified patent and that said Letters Patent is hereby corrected as shown below:

In the Claims:

Claim 9, Column 16, Line 39, please delete "analog memory" and substitute -- memory --

Signed and Sealed this  
Thirtieth Day of June, 2015

Michelle K. Lee  
*Director of the United States Patent and Trademark Office*